United States Patent
Corkum et al.

(10) Patent No.: US 6,878,900 B2
(45) Date of Patent: Apr. 12, 2005

(54) METHOD AND APPARATUS FOR REPAIR OF DEFECTS IN MATERIALS WITH SHORT LASER PULSES

(75) Inventors: Paul B. Corkum, Gloucester (CA); Emmanuel Dupont, Hull (CA); Hui Chun Liu, Orleans (CA); Xiaonong Zhu, Ottawa (CA)

(73) Assignee: National Research Council of Canada, Ottawa (CA)

(*) Notice: Subject to any disclaimer, the term of this patent is extended or adjusted under 35 U.S.C. 154(b) by 1 day.

(21) Appl. No.: 10/182,127
(22) PCT Filed: Jan. 25, 2001
(86) PCT No.: PCT/CA01/00072
§ 371 (c)(1), (2), (4) Date: Sep. 30, 2002
(87) PCT Pub. No.: WO01/54853
PCT Pub. Date: Aug. 2, 2001

(65) Prior Publication Data
US 2003/0111447 A1 Jun. 19, 2003

Related U.S. Application Data
(60) Provisional application No. 60/177,674, filed on Jan. 27, 2000.

(51) Int. Cl.[7] .......................... B23K 26/38; B23K 26/03
(52) U.S. Cl. ........................ 219/121.69; 219/121.76; 219/121.83
(58) Field of Search ..................... 219/121.68, 121.69, 219/121.83, 121.76

(56) References Cited

U.S. PATENT DOCUMENTS

| | | | | |
|---|---|---|---|---|
| 4,289,378 A | * | 9/1981 | Remy et al. | 359/368 |
| 5,208,437 A | * | 5/1993 | Miyauchi et al. | 219/121.68 |
| 5,656,186 A | * | 8/1997 | Mourou et al. | 219/121.69 |
| 5,808,272 A | * | 9/1998 | Sun et al. | 219/121.68 |
| 5,808,273 A | * | 9/1998 | Galster et al. | 219/121.69 |
| 6,046,429 A | * | 4/2000 | Datta | 219/121.69 |
| 6,590,182 B1 | * | 7/2003 | Domae | 219/121.69 |

FOREIGN PATENT DOCUMENTS

JP   63-56384 A   *   3/1988   ............ 219/121.83

* cited by examiner

Primary Examiner—Geoffrey S. Evans
(74) Attorney, Agent, or Firm—Freedman & Associates

(57) ABSTRACT

A method of accurately and precisely providing desired functionality to an electronic or opto-electronic component is disclosed in which a Femtosecond laser pulse is used to ablate material from a surface of or from within a component. The component is in active operation during the ablation process in order to facilitate the ablation process. The process also involves detection and feedback to indicate when a repair is sufficiently complete. The detection is also performed while the component is powered allowing in-situ detection and ablation. Of course, forms of facilitation other than feedback such as monitoring are also applicable to the invention.

27 Claims, 11 Drawing Sheets

METHOD AND APPARATUS FOR REPAIR OF DEFECTS IN MATERIALS WITH SHORT LASER PULSES

This application is the National Stage of International Application No. PCT/CA01/00072 filed Jan. 25, 2001, which claims the benefit of U.S. Provisional Patent Application No. 60/177,674 filed Jan. 27, 2000.

FIELD OF THE INVENTION

This invention relates to the field of laser repair of materials with structural defects and, more particularly, to a novel method and apparatus for the repair of microelectronic or opto-electronics devices with high power short laser pulses.

BACKGROUND OF THE INVENTION

Using a laser beam to repair defective microelectronic devices is an important technology employed in semiconductor industries, e.g. laser repair of IC chips and laser repair of lithographic photomasks. Typically, a method of laser repair requires two key steps—locating defects precisely and controlling the laser beam to impact only on the places where defects are detected. Simple though these requirements appear, it is often difficult to achieve both.

For example in repairing some electronic or optoelectronic devices, some defects and/or the effect of the defects are not easily identified until the devices are activated. Since laser beam repair devices often operate on wafers to correct identified problems, activating individual devices is not a trivial task. One approach to activating devices involves the use of probes for powering the devices. Probes for testing integrated circuits within a wafer are known in the art. Typically, when used, the probes are positioned to power the device. A defect is detected and the power to the device is terminated. A laser is used to repair the defect. The probes are then positioned again, when necessary, for powering the device and the testing continues. Often the probes form part of an imaging device and the laser forms part of another device. As such, the electronic devices need to be moved between devices. As is evident, it is possible that a single defect will require numerous iterations before being corrected.

Because laser repair involves a process of verifying results of a repair operation, when the repair is performed in a non in-situ manner, repeatedly mounting and dismounting the electronic device is common.

Conventional laser repair of micro electronic devices typically uses nanosecond laser pulses. Nanosecond laser pulses produce problems relating to relatively large heat-affected-zone, melting, and melting related collateral damages. In many applications this deleterious situation can be circumvented, by the accurate positioning of the laser. This results in a known or pre determined heat-affected zone permitting reasonable repair results; For some applications this approach could be particularly more effective and more precisely controlled if a method could be provided to provide feed back in real time during the repair . . . . Unfortunately, such a system does not exist in the known art with nanaosecond lasers.

Another shortcoming of nanosecond lasers when used in repairing electronic devices are plasma effects noticed when the laser acts on plasma formed during heating. Plasma effects can affect conductivity of the material and so forth. Thus, heating the plasma further may result in short circuits at a location proximate the repair or at a location of the repair. A short circuit results in heat dissipation within the electronic device which in turn results in further heating and compounds the collateral damage to the device. It would be advantageous to provide a repair process for repairing electronic and/or opto-electronic devices that is operable while the device is powered.

It is also advantageous to perform in-situ repair such that the result of repair is monitored as it is being performed without dismounting the device.

SUMMARY OF THE INVENTION

According to the invention there is provided a method of laser ablation from an electronic or opto-electronic component comprising the steps of: providing an electronic or opto-electronic component; providing to the component power and/or a signal to facilitate identification of a region to be ablated; while maintaining power and/or signal to the component aligning a laser having a short pulse duration of less than a nano-second with a component from which to remove material; and, while maintaining power and/or signal to the component firing the laser having a short pulse duration of less than a nano-second at least once in order to remove material from the component.

According to the invention there is also provided a method of laser ablation from an electronic or opto-electronic component comprising the steps of: providing an opto-electronic or electronic component; providing a low energy alignment beam projector for directing a low energy beam of light; providing a laser for delivering light pulses for which the width is sufficiently short and the intensity sufficiently high to removing material around a focal region while minimizing peripheral damage; aligning the low energy beam of light and the light pulses; determining locations on the component for ablation of material therefrom; aligning the low energy beam of light toward the determined locations; while maintaining alignment of the low energy beam of light, firing the laser to ablate material from a determined location from the determined locations.

According to another aspect of the invention there is provided a system for ablating material from an electronic or opto-electronic component comprising: a detector for locating a location from which to ablate material; a high energy laser for delivering light pulses the width of which is sufficiently short and the intensity sufficiently high to provide minimal substantial peripheral damage during material removal; a low energy alignment light source; a first optical path for receiving light from the laser and directing the light toward a focal point; a second optical path for receiving light from the low energy alignment light source and directing the light toward the focal point; a system for controlling a pattern of the laser in the vicinity of an electronic component.

BRIEF DESCRIPTION OF THE DRAWINGS

The invention will now be described with reference to the attached drawings in which like reference numerals refer to like objects and in which.

DETAILED DESCRIPTION OF THE INVENTION

Figure 1:
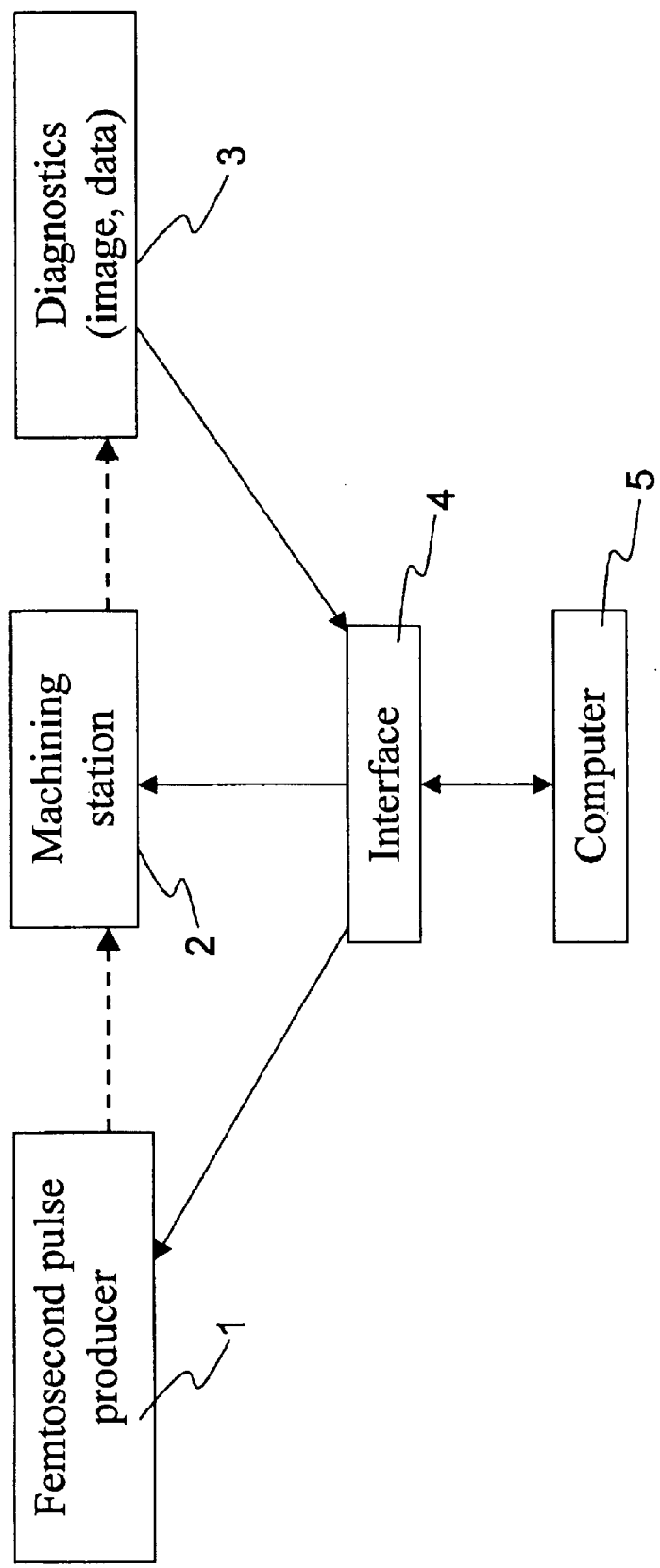
FIG. 1 is a block diagram schematically illustrating a femtosecond laser repair system in accord with the present invention.

For repairing powered electronic devices, the use of nanosecond lasers is problematic. Because of the relatively large heat-affected zone caused by the deposited energy of a nanosecond laser pulse, plasma effects and unwanted melting are common. These effect areas of the electronic device are collateral to the targeted area and as such, in turn, have a potential to cause further defects. The problems are even more significant when the electronic device is powered. For example, heating of collateral metal leads within an integrated circuit during repair results in some expansion of those leads. The expansion may lead to increased capacitance between leads or to a short there between. If testing of the device is occurring during the repair process, the increased capacitance will change the operating characteristics of the device and may affect device failure. Even more catastrophic is a short which may join two driven lines, power and ground for example, and result in heating of the electronic device either about the repair or at other unknown locations within the device. For this reason and others, it is not advisable to repair an integrated circuit device with a nanosecond laser during operation of the integrated circuit.

It has now been found that using short laser pulses in the form of, for example, femtosecond laser pulses eliminates the above noted problems in repairing microelectronic devices. Under similar focal conditions, the extremely short time duration of femtosecond laser pulses enables them to have much higher intensity than nanosecond pulses. Besides the focusing in two transverse dimensions, the photon density of femtosecond laser pulses is optionally greatly increased by reducing the spread of the laser pulse along the third longitudinal dimension. It is therefore possible with femtosecond laser pulses to machine—to drill, scribe and cut—a material with much lower pulse energy and higher precision. The interaction between the ablated material and the remaining laser field, which is typical in the regime of nanosecond laser repair, is not present in substance in femtosecond laser use. Typically, because of the reduced energy of the femtosecond laser pulses and the extremely short duration thereof, there is insufficient pulse to interact with product of the heating produced by the pulse within the time frame of a single pulse. This also contributes to a clean repair using femtosecond laser pulses.

In U.S. Pat. No. 5,656,186 issued to Mourou et al. On Aug. 12, 1997 and incorporated herein by reference a Method For Controlling Configuration of Laser Induced Breakdown and Ablation is described using a short duration pulse laser. The basic disclosure relates to using such a short duration laser in order to ablate material with higher precision to drill more precise holes having narrower widths. The patent also relates to a method for determining a pulse width for achieving said goal. Though the method and device of Mourou is functional, it does not address the above noted problems in laser based ablation of electronic components.

In contrast, the method of the invention enables effective repair of microelectronic devices with defects by in-situ short pulse ablation to either isolate defective areas from a remainder of non-defective areas or to eliminate a defect directly.

An exemplary application of this invention relates to a surgical repair of microelectronic devices, it is based on an accurate alignment of the defect with the beam. Practically, an all-optical method to achieve this alignment is advisable. This method is well adapted for the small defects that have a lower resistivity than the rest of the device. As a result, these defects act as local electric shunts, and depending on the design of these devices, they can be observed as brighter spots in a luminescence, electroluminescence or/and thermal map of the entire device. These brighter spots show up either naturally, or the device is processed so that the defects appear as bright or intense photon emitters when the device is powered or appropriately excited. For example, sacrificial light emitting layers—semiconductor, polymer materials for instance—are deposited temporally onto the surface of the devices to show the defects; cryogenic temperatures are typically employed to evidence these defects.

In another embodiment, the present invention provides an apparatus for in-situ repairing of microelectronic devices that includes a near-infrared laser amplifier for generating single to multiple 50 femtosecond laser pulses; a computer controlled interface system for synchronizing firing and displacement of femtosecond laser pulses; an optical system and an imaging device in the form of a CCD camera for example, for collinearly overlapping the femtosecond laser beam with a low power alignment laser beam, and for monitoring the process of repair; a second imaging system having a larger field of view for locating the defects of the microelectronic device and overlapping the defect with the spot of an alignment laser beam; and for examining the results of a repair without dismounting the device.

Among the numerous microelectronic devices that can be repaired with the proposed invention, the large area pixel-less quantum-well infrared photodetector (QWIP-LED) was found to be one of the most convenient to demonstrate the advantages of the invention. This device functions as a special imaging device that maps a scene of mid/far-infrared emission to a near-infrared image. Without an addressing grid across the detector as most two-dimensional pixel type imaging detectors have, such a device has the great advantages of simplicity, superior spatial resolution, and being promising for scaling to larger sizes. One of the problems in making such devices because they are pixel-less—the whole device driven by a single power source—is that the presence of a defect affects the performance of the whole device. Depending on the extent of the defect(s), in some situations the effect of a defect is so devastating that the entire device is not usable. In such cases, a repair becomes very useful in order to increase yield thereby reducing costs. Laser pulses are used to make micron-sized trenches around the defected spot so that the defect(s) is electrically isolated. For doing this, it is proposed to use an in-situ optical system to pin point the defects and to deliver the precisely controlled laser ablation beam as required.

Those skilled in the art will recognize that the same principles are equally applicable to the fabrication of a device requiring removal of material in a specific area to provide predetermined device functionality.

More specifically, this section describes the exemplary implementation of the invention for the repair of far-infrared quantum-well photodetectors integrated with light emitting diode. Of course, the exemplary implementation of the invention is also useful for manufacturing or repairing other electronic or opto-electronic devices. Preferably, it is used with miniaturised devices wherein precision and accuracy are essential.

Referring to FIG. 1 there is shown a layout of a laser repair system employing femtosecond laser pulses. Both the femtosecond laser pulse producer 1 and the machining station 2 are controlled by the computer 5 via an analog to digital two way, multi channel converter interface 4. Diagnostics 3 are optionally a combination of photodetector(s), imaging device(s), optical powermeter(s) and other optical sensors. The output signal of these detecting devices are also sent to the computer 5 through the interface 4 for assisting alignment; recording and/or analyzing purposes.

The femtosecond laser pulse producer 1 as described by Zhu et al (Applied Surface Science, Vol. 152, 138–148, 1999,) comprises a femtosecond Ti:sapphire oscillator, pulse stretcher, regenerative Ti:sapphire amplifier and pulse compressor all centered around 800 nm optical wavelength. The amplifier is controlled via the computer 5 to produce either single or multiple pulses with a selectable pulse interval, or a continuous pulse train at a given repetition rate. Also, through using the computer control program the pulse duration is optionally adjusted continuously from 40 fs up to 15 ps, the pulse interval is variable from, for example, one second down to 3 microseconds corresponding to a repetition rate of between 1 Hz to 350 kHz. The pulse energy available for laser repair is adjustable from zero to over 3 micro Joule by use of a neutral density optical attenuator(s). The typical operation parameters for laser repair described herein are pulsewidth: 60 fs; pulse interval: 10 ms; and pulse energy at the sample surface: 250 nJ. Of course, other operation parameters such as pulse duration may also be included as operational parameters so long as their variation achieves a result similar to variation of another operational parameter.

Control of machining station 2 by computer 5 is for setting direction, step size, speed, axis of relative motion between the device to be repaired and the repair laser beam. All these parameters are entered via the computer keyboard and implemented by step motor driven translation stages. Of course, the parameters are enterable in other fashions such as from electronic storage, through processing of images to automatically determine parameter values and so forth. Further illustration of Machining station 2 and Diagnostics 3 in FIG. 1 are found in FIG. 2A, FIG. 2B and FIG. 3.

To effectively repair defects with laser pulses and to minimize damage to non-defective areas about a defect, it is advantageous to pin point the defect with the repair laser beam. Of course, such an implementation is costly and a single laser for multiple uses is not preferred when two single use lasers are less expensive. Thus, in the embodiment of FIG. 2A a low average power alignment laser beam is co-linearly aligned with the femtosecond repair laser beam and is used to align the repair laser beam. The system overlaps the defect spot with the alignment beam as illustrated in FIG. 2B.

Figure 2A:
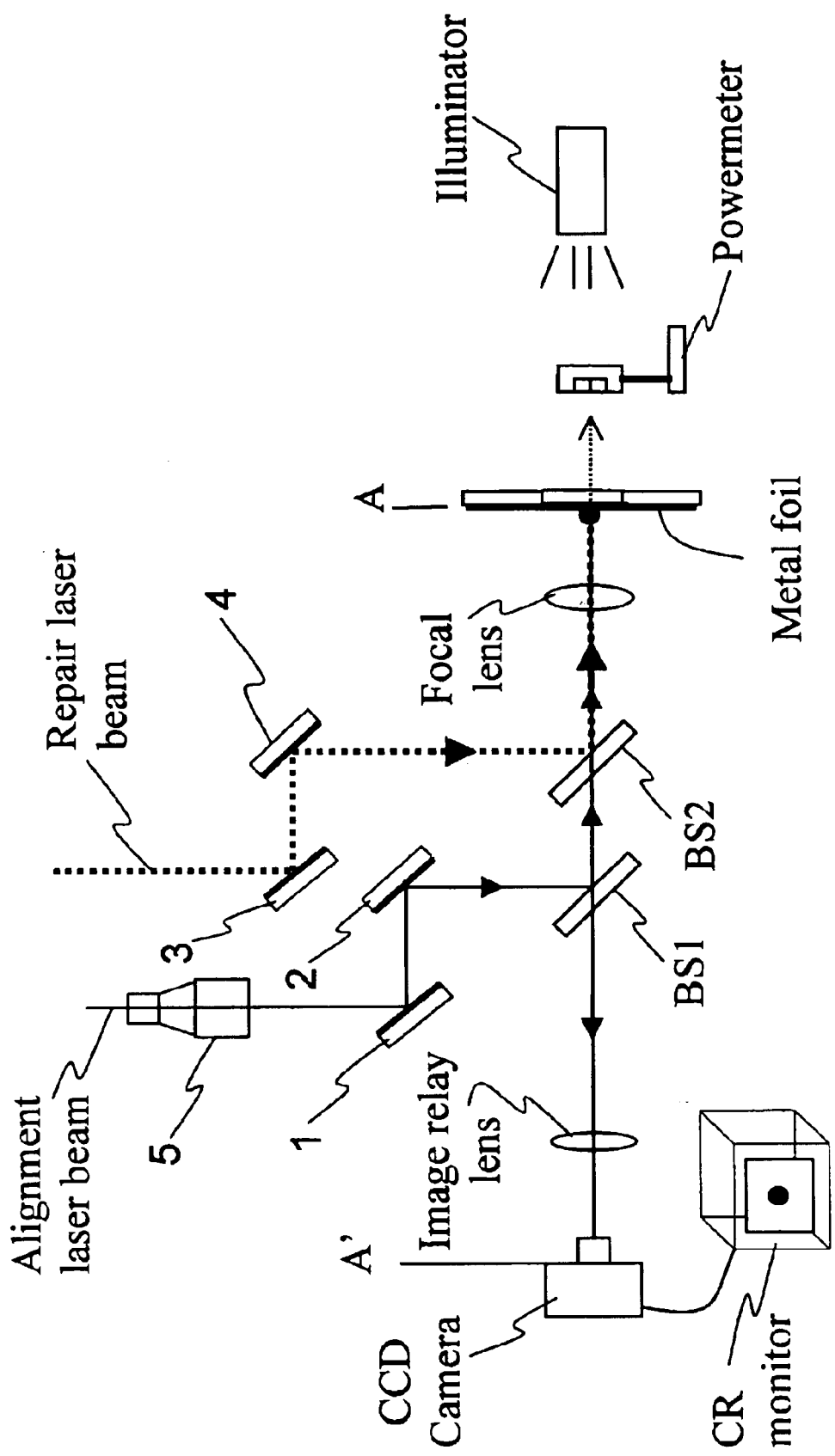
FIG. 2A is a schematic representation of the machining station and diagnostics of the laser repair system of FIG. 1, illustrating how a low average power, visible, alignment laser beam is overlapped co-linear with the femtosecond laser repair beam in accord with the present invention.
Figure 2B:
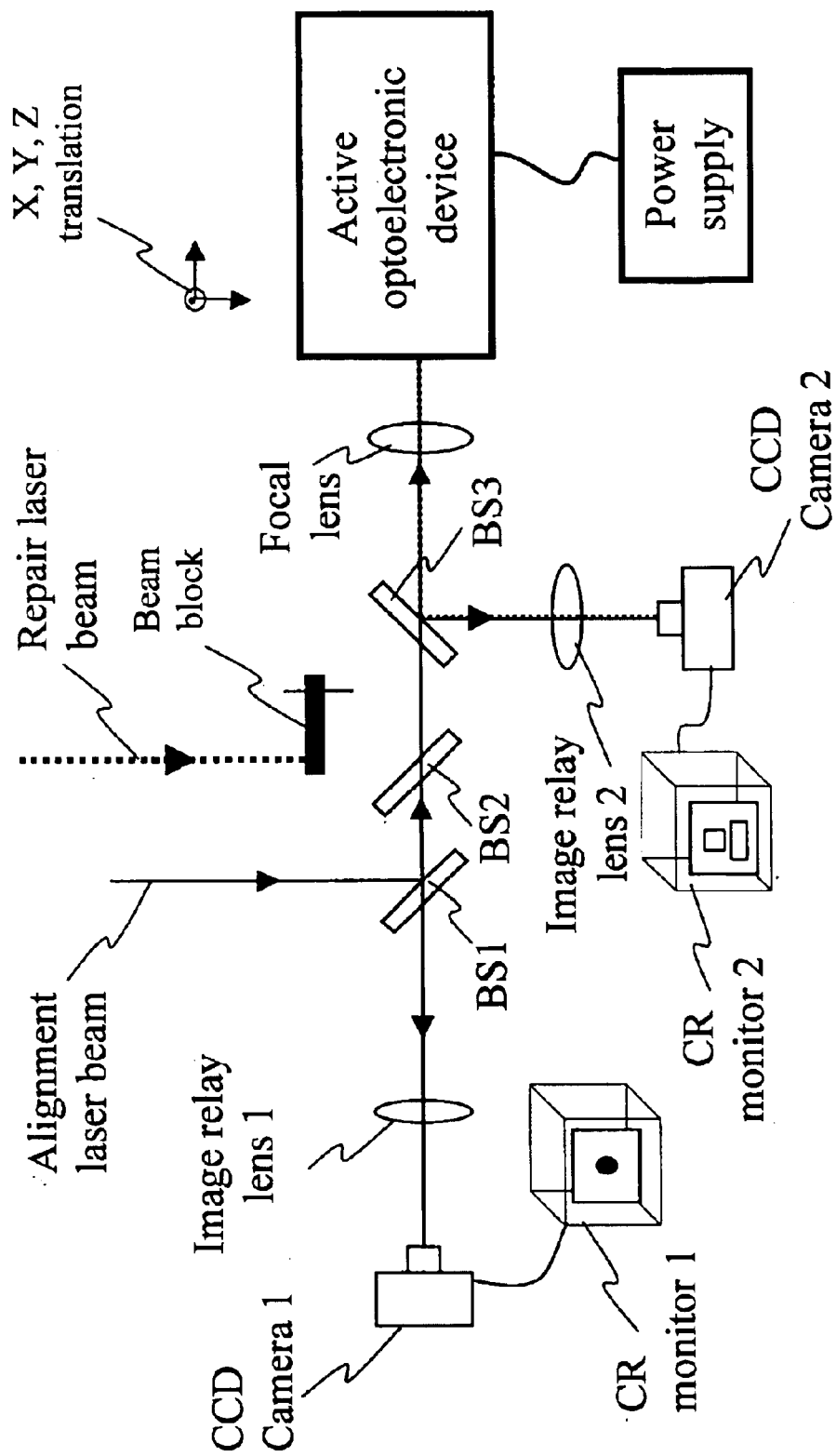
FIG. 2B is a schematic representation of the machining station and diagnostics of the laser repair system of FIG. 1, illustrating how a defect spot in a microelectronic device is located and overlapped with the alignment laser beam in accord with the present invention.

Referring to FIG. 2A, use of steering mirrors 1, 2, 3, and 4 facilitates the task of co-linearly overlapping the alignment laser beam with the repair laser beam. The two beams are overlapped after merging at the front surface of the beamsplitter BS2. Beamsplitter BS2 has high reflectivity for the repair laser beam and sufficient transmitivity for the alignment laser beam, an exemplary type of which is a low power, 632 nm He—Ne laser.

The focal lens for laser repair is preferably a 10× microscope objective with a focal length of 1.6 cm, which leads to a focal spot size of ~5 microns in diameter for the repair laser beam and a practical and manageable working distance. Preferably, an adjustable beam expander (5 in FIG. 2A) for the alignment beam is used to control the size of the alignment beam such that its focal spot is comparable with or slightly larger than that of the repair beam, and the focused waists of the two beams is also similar along the beam propagation direction. When this is the case, use of the alignment beam to pin point a defect results in very accurate placement of the repair beam. Alternatively, the alignment beam is of a different size from the repair beam.

As shown in FIG. 2A, the focal spot of the alignment beam on a sample surface (plane A) is imaged onto a CCD camera (plane A') through the image relay lens and displayed on a cathode ray monitor. Spatial overlap between the alignment laser beam and the repair laser beam is verified by drilling small holes on a thin metal foil with the femtosecond repair beam, and by looking at the change of He—Ne laser reflection on the CCD camera during ablation. An optical powermeter is placed behind the metal foil, e.g. a 25 micron thick aluminum foil. If the two beams are properly overlapped, a through hole made by firing a number of repair laser pulses will lead to maximum reading of the power of the alignment laser beam that passes through the hole. Without taking out the sample, a backward illumination of this through hole results in a picture of the hole shown on the monitor, which after proper calibration enables one to have an idea of the size and the shape of the hole, which is affected by the quality and the parameters of the femtosecond repair laser beam.

FIG. 2B is a further extension of FIG. 2A showing how defects of a microelectronic device are accurately located and aligned with the alignment beam. This is achieved by introducing a beamsplitter BS3 and a second set including an image relay lens, a CCD (charge coupled device array) camera and a CR monitor into the system. The proper setup of the added image relay lens 2 and CCD camera 2 allows a relatively larger field of view of the front surface of the device to be repaired. Any defects within this view are displayed on the screen of the monitor 2. For convenience a zoom of a view of the defect is typically provided by CCD camera 1, depending on the scale of the defect. Alternatively, the zoom is provided by a processor in communicaiton with the CCD camera 1. With the two cameras having different fields of view, searching for defects is thus easier. The active opto-electronic device is mounted on translation stages of X, Y, Z—three axes. Movement of the device along X and Y directions enables the CCD camera 2 to image the entire surface area of the device where defects may occur. Also recorded by CCD camera 2 is the reflection of the alignment laser spot on the device. Aligning the alignment beam spot with a defect location is performed by carefully translating the device in the X and Y planes.

Figure 3:
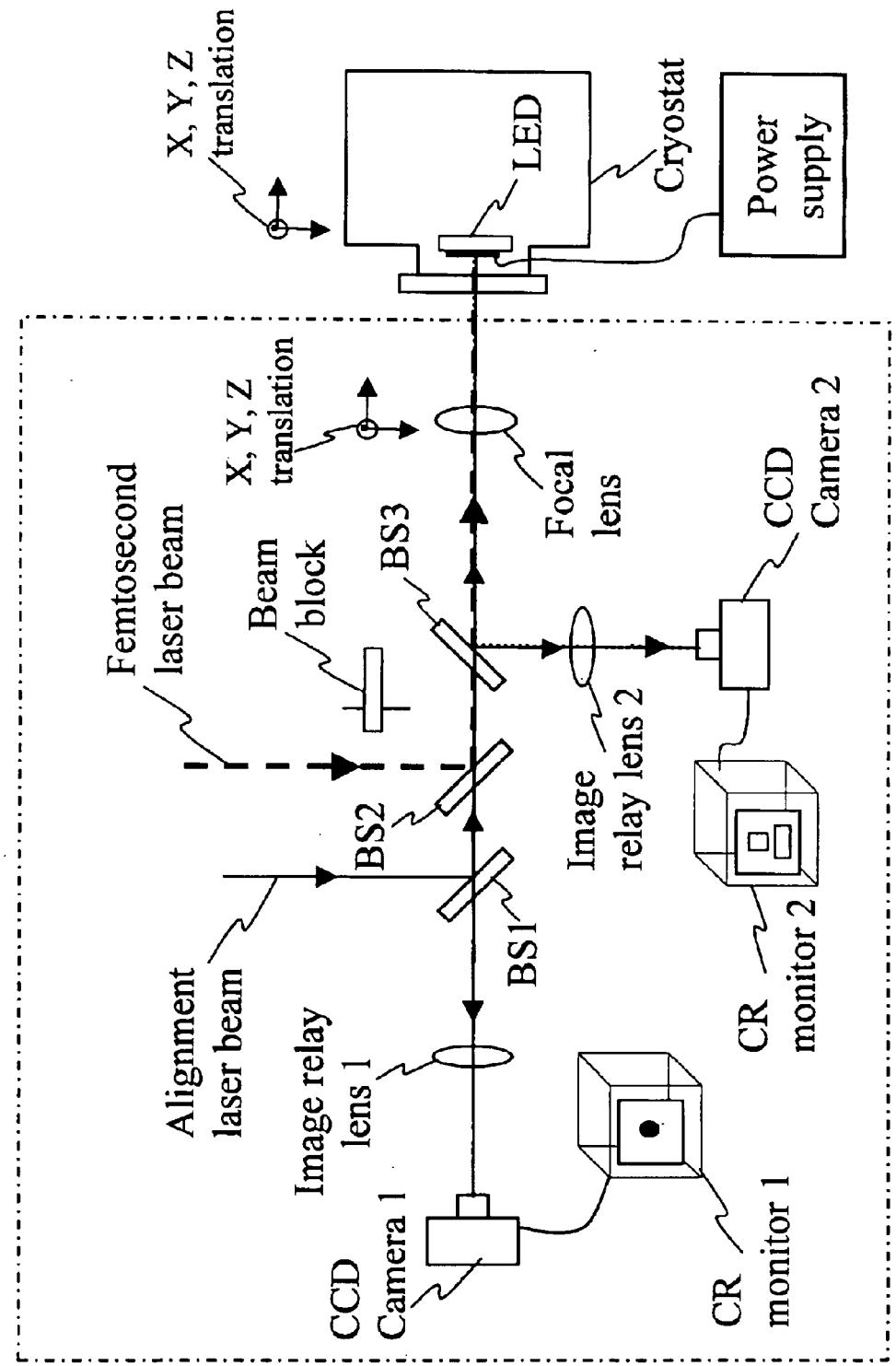
FIG. 3 is a schematic graph illustrating how an in-situ repair of a microelectronic device, in particular a far-infrared quantum-well photodetector integrated with a light emitting diode, implemented in accord with the present invention.

FIG. 3 is a schematic graph illustrating an implementation of an in-situ repair of one type of microelectronic device, a far-infrared quantum-well photodetectors integrated with light emitting diode (or, QWIP-LED). The GaAs-based quantum well device maps a far infrared image signal into a near infrared surface emission in a pixel-less manner. Crystallographic defects present in the device, however, physically reduce the local electrical impedance and thus lead to bright electro-luminescent emission or hot spots when the device is powered. These hot spots not only themselves lose their designed mapping function but also affect neighboring areas within the device because of their significant drain of electric current and the resulting change of electric field distribution within the neighboring areas of the microelectronic device. A known approach to repairing the device is to effectively isolate these defective spots electrically from the neighboring area.

In the laser repair method of the present invention, the QWIP-LED device is included inside a liquid nitrogen cooled cryostat with an optical window facing the alignment laser beam which has been co-linearly aligned with the repair laser beam as described above. The LED device is first brought to the focus of the focal lens by translating the device and/or the focal lens along the laser beam direction (Z-axis), and by looking at the reflection of the alignment laser beam on CCD camera 1. The defects are then located with the help of CCD camera 2. After proper alignment of a detected defect location with the alignment laser beam detected with both CCD cameras 1 and 2, the repair femtosecond laser is fired. Optionally, either the focal lens or the device under repair is set into a pre-programmed motion.

Figure 4A:
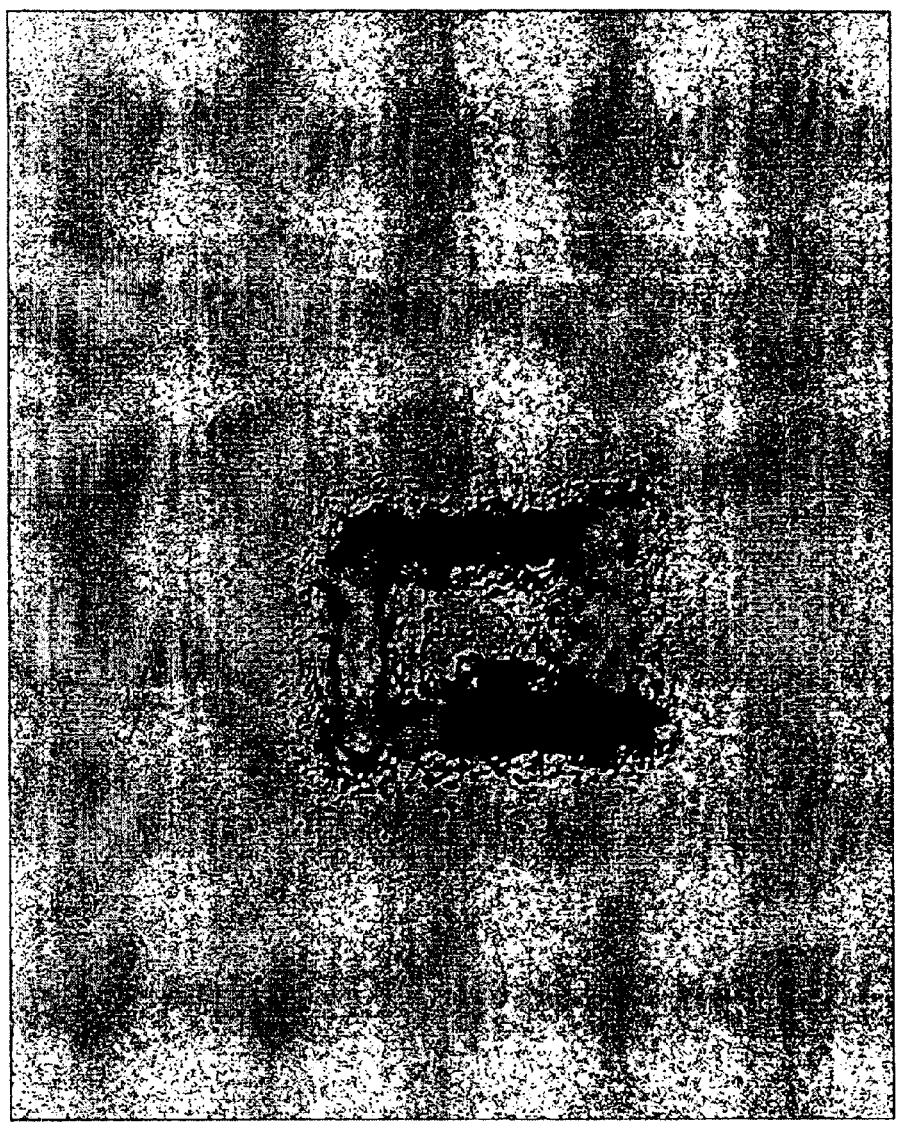
FIG. 4A is an optical micrograph of an exemplary square trenches produced by directing femtosecond laser pulses onto a GaAs sample in accord with the present invention.

FIG. 4A is an optical micrograph of an exemplary 25 micron square trench produced by focusing 60 femtosecond, 250 nJ laser pulses onto the surface of a QWIP-LED device. The associated laser energy fluence in forming the trench is typically around 1 $J/cm^2$. In order to etch a continuous trench like the one shown in FIG. 4A, the step size of the focal lens movement is set at 2 microns, and at each position two femtosecond laser pulses are directed toward the QWIP-LED device. The writing of this isolation square trench was repeated 7 times to be certain that the defect located inside the square is completely isolated electrically. Of course, the optical detection of the error is also a useful indicator of the completion of a repair. Since the QWIP-LED device is in a state for detecting defects using the CCDs 1 and 2, this detection process is optionally executed at intervals to ensure that a repair underway is being performed adequately and cost effectively.

Figure 4B:
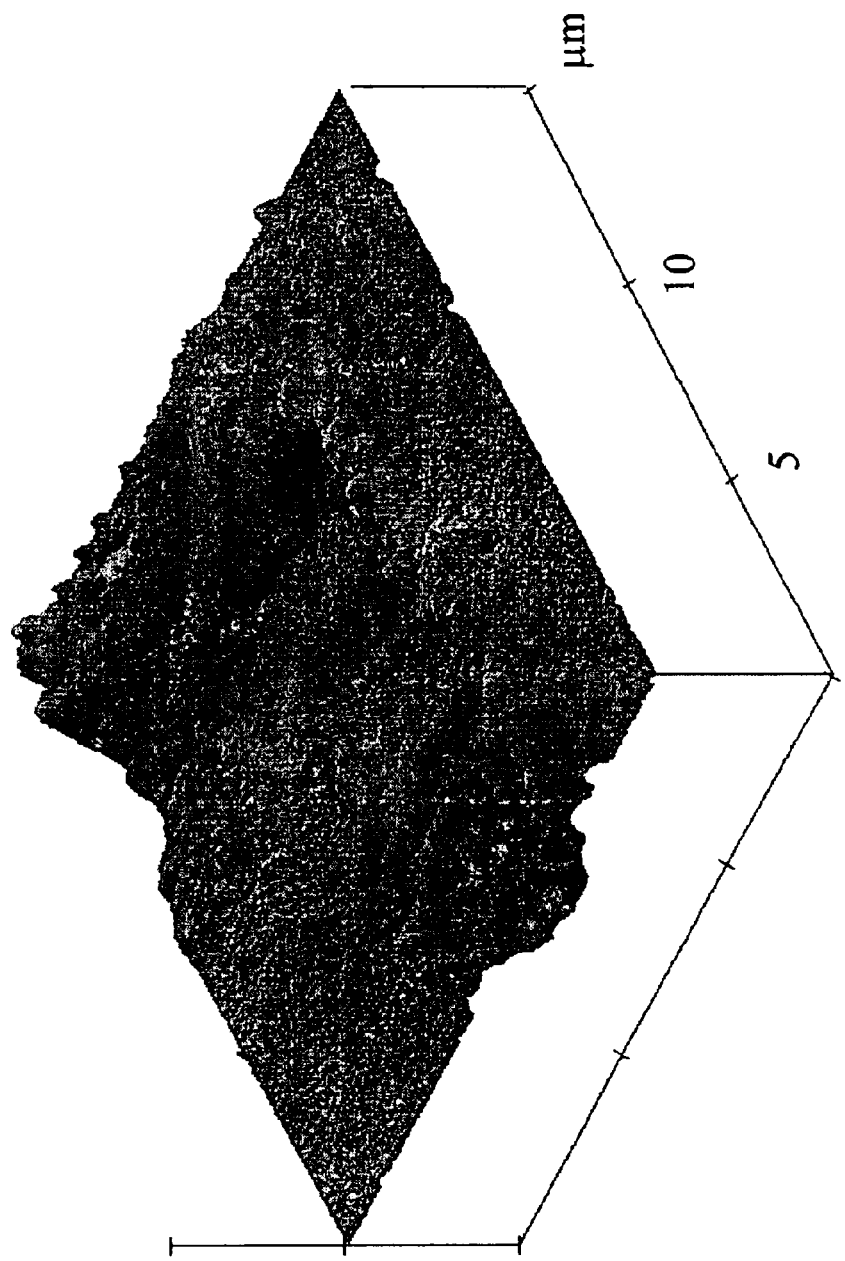
FIG. 4B is a graph taken through an atomic force microscope (AFM) illustrating the morphology of a corner of the micro trenches produced by femtosecond laser pulses in accord with the present invention.

FIG. 4B is a graph taken through an atomic force microscope (AFM) illustrating the morphology of a corner of the square trench produced by femtosecond laser pulses. In order to completely cut off of the electrical path way of the defect from the surrounding area it is currently believed to be necessary that (1) the trench has a closed loop, namely, there is no gap between the starting point and the ending point; (2) there are no rims high enough to effect functionality and no debris of significant size inside the trench. To meet the first requirement, it is necessary to counteract backward motion of the translation stages driven by step motors. For example, this is implemented by proper control of the motion of the translation stages, e. g. avoiding backward motion during the laser writing, or adding extra steps of the last line writing that closes the loop. To meet the second requirement, the step size of the translation is set at 2 micron or less. Also, the energy fluence is carefully selected. Preferably, the energy fluence is around 1 $J/cm^2$. Energy fluence either too low or too high is preferably avoided. Fluence that is too low leads to insufficient material removal requiring too many iterations. Fluence that is too high increases the size of the area bound by the trench and thus sacrifices non-defective surface area of the device.

Figure 5:
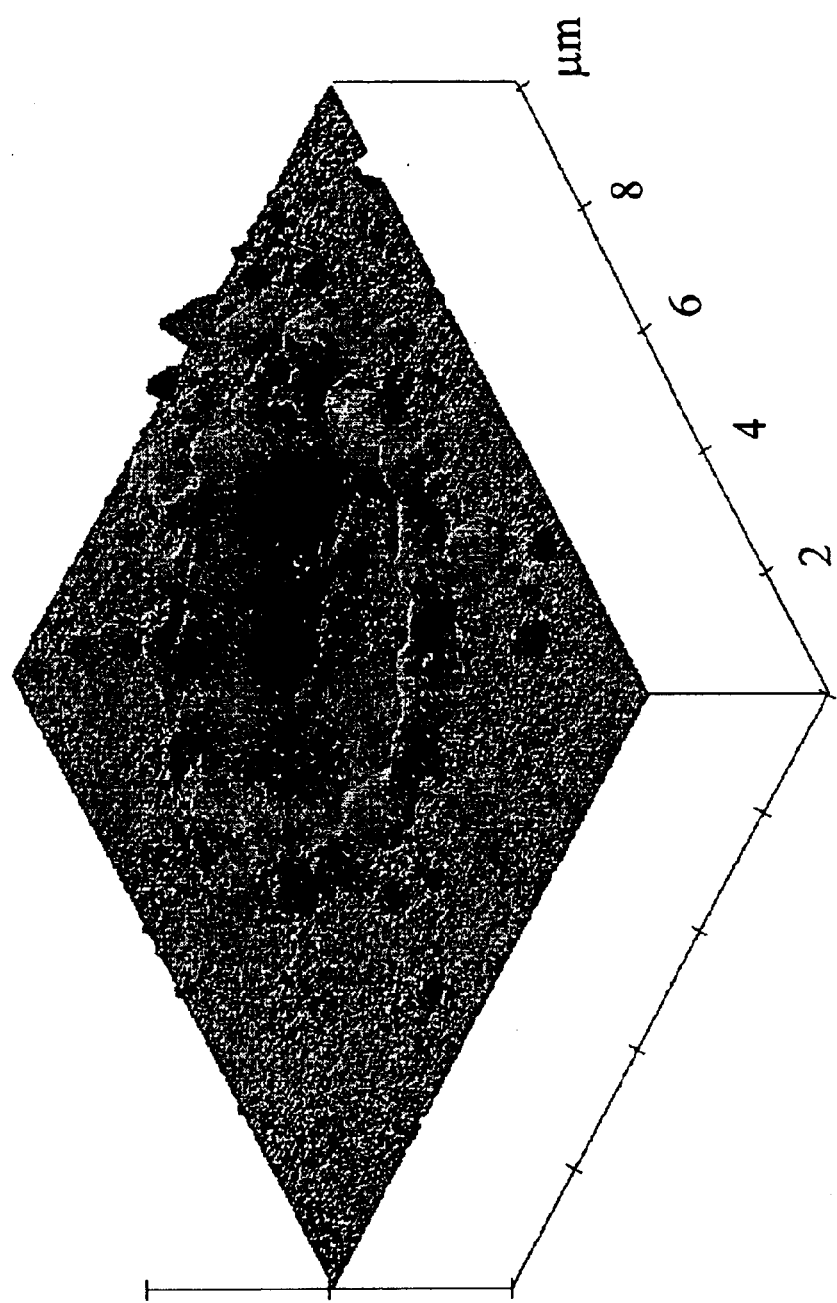
FIG. 5 is another graph taken through an atomic force microscope illustrating the morphology of an exemplary crater produced by directing two femtosecond laser pulses onto a GaAs sample at the same spot in accord with the present invention.

FIG. 5 is another graph taken through an atomic force microscope illustrating the morphology of an exemplary crater produced by directing two focused femtosecond laser pulses onto the surface of a GaAs semiconductor substrate. Use of femtosecond laser pulses at a selected energy fluence of 1 $J/cm^2$ provides ablation without mixture of different material phases. It also provides for little damage to collateral areas—areas surrounding the locaiton of the ablation. Providing that a defect has a lateral size small enough, instead of making trenches around the defect, another approach to repair the device is to focus femtosecond repair laser pulse(s) right on the defect so that the whole defective area is ablated. This approach is advantageous due to repair efficiency and reduced damage to non-defective areas. Conversely, when the detected defect is large, the amount of ablation required to remove the flaw is prohibitive.

Figure 6A:
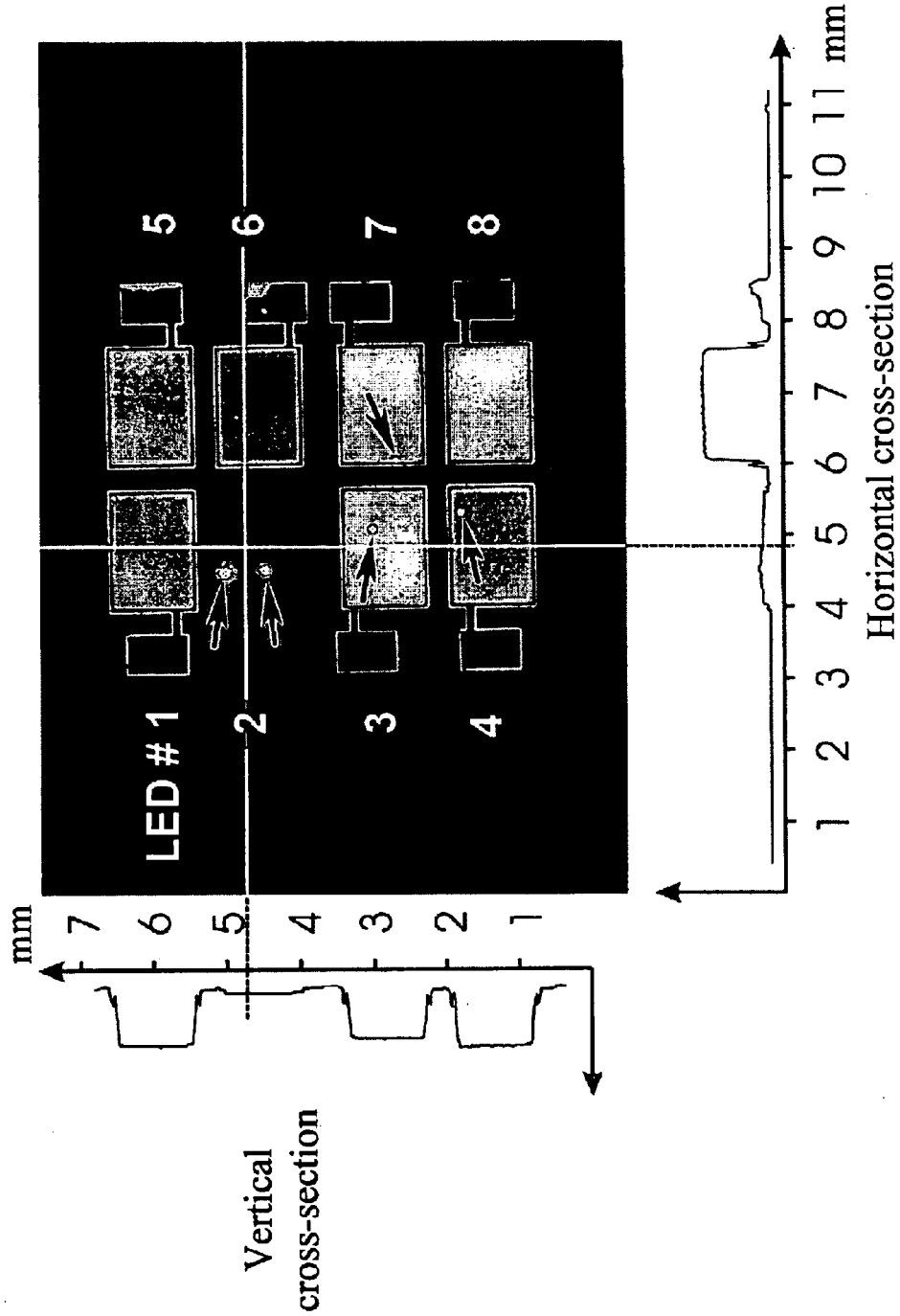
FIG. 6A is the electroluminescent map of a pixel-less far-infrared quantum-well photodetector integrated with a light emitting diode showing the effect of the presence of defects—"hot spots" as pointed by arrows—before laser repair in accord with the present invention.

FIG. 6A is the electroluminescent picture of an eight pixel-less far infrared quantum well photodetector LEDs showing the effect of the presence of defects before laser repair. For LED #2, the two severe defect spots indicated by arrows completely short-circuit the device such that the rest of the device is not luminescent. The vertical and the horizontal cross section plots of the luminescent level shown on the left and the bottom of the picture further illustrate this observation. Using the setup of FIG. 3, square shaped micro trenches of a few micron deep, and approximately 5 microns wide (such as those shown in FIG. 4A) are produced to electrically isolate the defective spots shown in FIG. 6A.

Figure 6B:
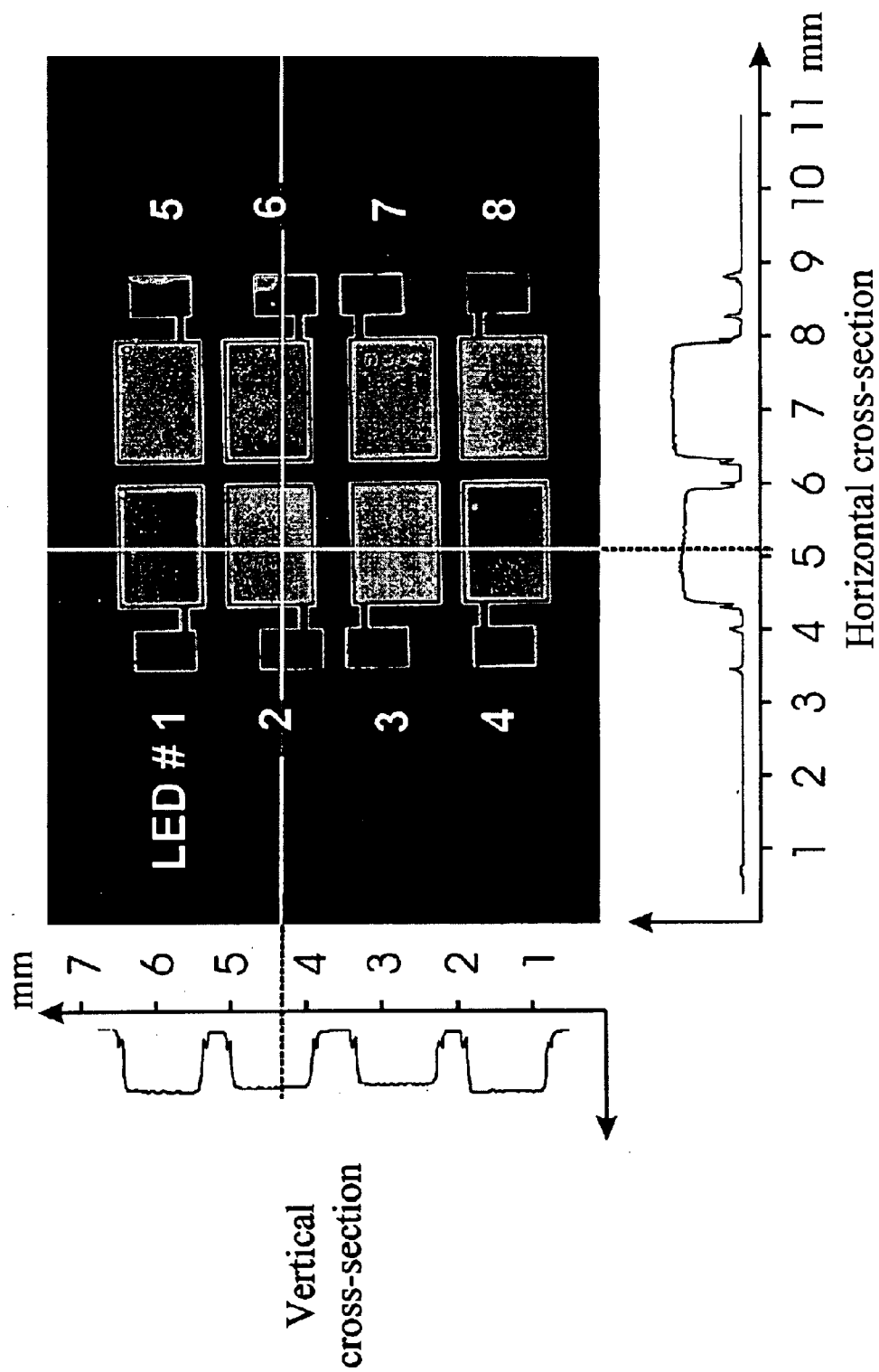
FIG. 6B is the electroluminescent map of the same device shown in FIG. 6A after laser repair in accord with the present invention—During repair, micro trenches of a few micron deep, and approximately 5 micron wide are produced by femtosecond laser pulses to electrically isolate the defected spots.
Figures 7A, 7B:
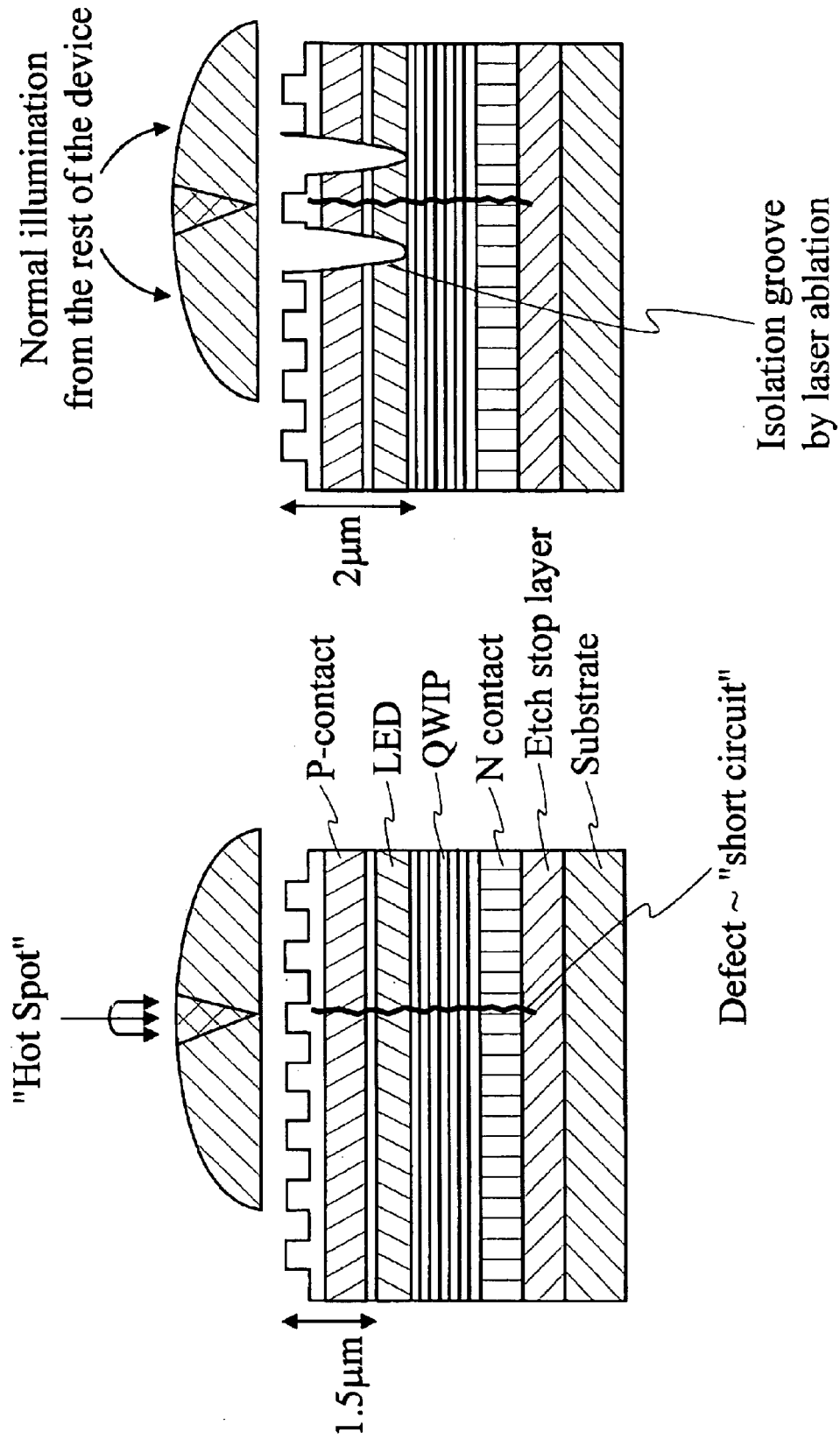
FIG. 7A is a cross-sectional view of a component with a defect.
FIG. 7B is a cross-sectional view of a component with a defect repaired.
Figure 8:
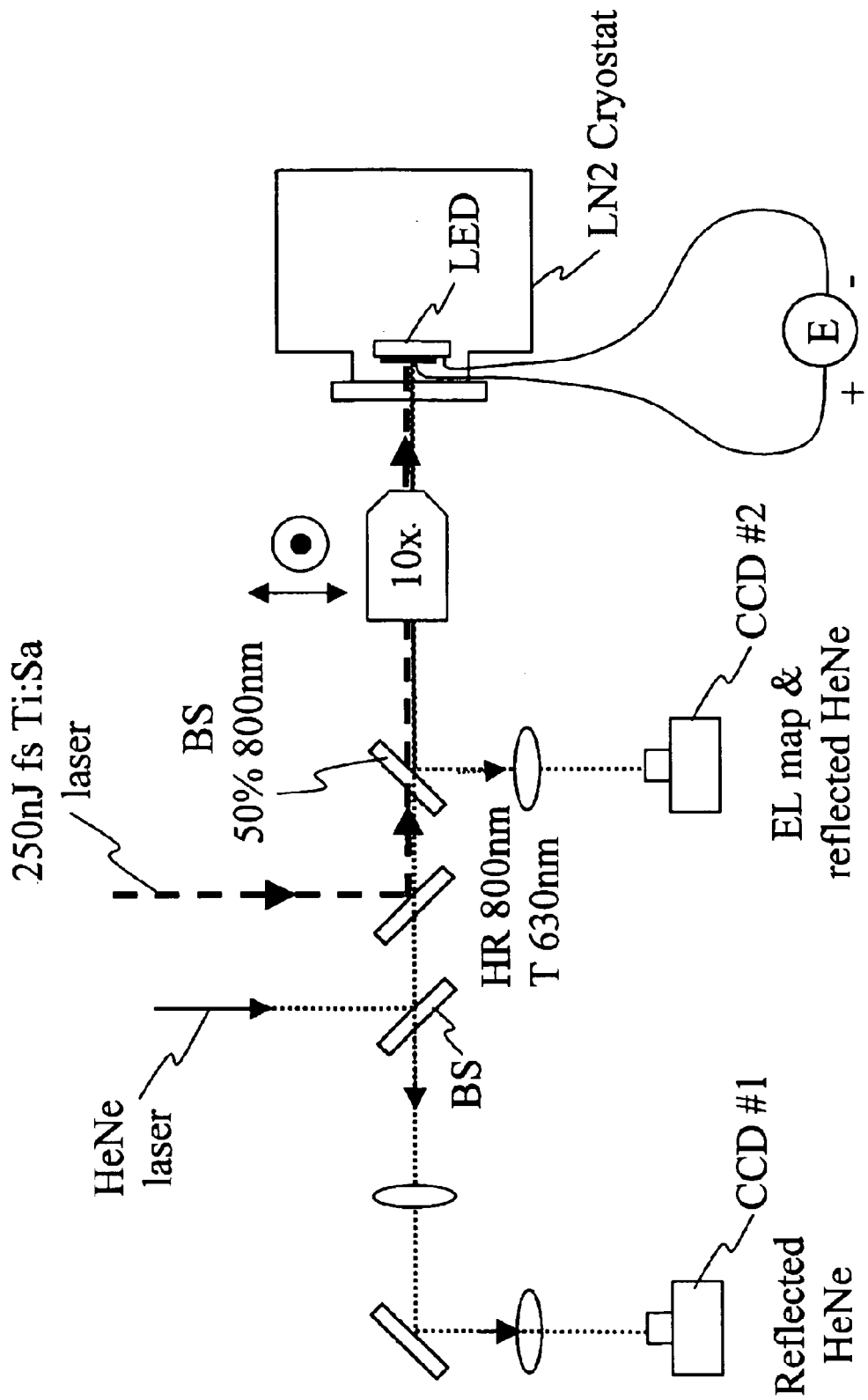
FIG. 8 is a simplified diagram of an embodiment of the invention.

FIG. 6B is the electroluminescent picture of the same devices shown in FIG. 6A after laser repair according to the invention. All the bright spots shown and indicated in FIG. 6A are no longer present in FIG. 6B. They are all effectively eliminated with the laser-made micro trenches. The uniformity of the LED emission is thus noticeably improved. In particular, LED #2 is now repaired and emitting light across the whole 16 $mm^2$ device area. Because the device was powered during the repair operation, it is a straightforward task to determine when sufficient ablation has been performed to correct the defect. For example, once the LED is radiating above a predetermined luminance, then the repair process terminates. Alternatively, the repair process does not rely on feedback from the component in use.

Referring again to FIG. 2B, it is recognized by those of skill in the art that application of high power lasers to ablation of material is usually performed by focusing the laser on the material. As the material is ablated, the focus of the laser may no longer remain on the surface of the material being ablated. In fs lasers, this is of particular concern due to their accuracy and localized effects.

The system of FIG. 2B is designed to accommodate a CCD in line with both lasers and the point on the surface of the component affected by the high power laser in order to monitor numerous aspects of the process. For example, the ablation is monitored. Alternatively alignment of the alignment beam and the high power laser beam is monitored.

In an exemplary embodiment, focus of the high power laser on the surface of the component is monitored. This is performed by measuring the beam circumference detected to ensure that it is within acceptable focus. As the component surface moves more than a predetermined distance form the preferred location, the laser beam is imaged larger—out of focus—by the CCD. An automated system to move the component or the focal point of the laser beam is then used to optimize the focus. As such, very straight and narrow ablation is performed.

It is noteworthy that by focusing the laser beam onto the surface of the component, an accurate measure of the amount of material ablated is determined. For example, if the component surface was originally in focus and now must be moved 0.01 mm to result in a laser beam that is properly focused, it is determined that 0.01 mm of material has been ablated from the surface of the component.

Typically, holes drilled with a high power laser have a less than rectangular cross section with the bottom of the hole typically being somewhat rounded. Beam shaping is useful in modifying the cross section of a hole in order to achieve a more desired cross section.

The use of fs lasers is also possible for heating and therefore modifying a component below its surface. For example, when visible light is used and the component is optically transparent, the laser can be used to modify the component at a distance d below its surface determined by focusing the laser beam at that distance below the surface.

Micro-channel devices are known in the art. For example a microchannel amplifier relies on a cascade of electrons within a microchannel and triggered by a single external electron impinging within the microchannel. Typically, in the manufacture of these devices a low yield results. According to the invention, a method is provided for repairing these devices during use and/or during fabrication.

Because the invention allows in situ testing and repair of components, the invention is applicable to use within a manufacturing process. When a component comprises numerous layers, the process is implemented for each layer to eliminate defects within layers prior to proceeding to subsequent layers. Alternatively, the process is implemented after a predetermined number of layers to detect and correct defects.

Numerous other embodiments may be envisaged without departing from the spirit or scope of the invention

What is claimed is:

1. A method of laser ablation from a component comprising:
   providing the component;
   providing at least one of power and a signal to the component to facilitate identification of an area to be ablated;
   while maintaining at least one of power and a signal to the component, aligning a laser having a short pulse duration of less than a nano-second with the identified area of the component to be ablated; and,
   while maintaining at least one of power and a signal to the component, engaging the laser having a short pulse duration of less than a nano-second at least once in order to remove material from the electronic or opto-electronic component.

2. A method according to claim 1 wherein the component is one of an electronic and opto-electronic component.

3. A method according to claim 2 wherein aligning the laser is performed to align the laser to correct a defect, the aligned laser aligned for ablating material in order to eliminate significant effects of the defect on circuit operation.

4. A method according to claim 3 wherein aligning the laser is performed by the steps of:
   aligning the laser to correct the defect, the aligned laser aligned for ablating material about a defect in order to isolate the defect from the remainder of the component.

5. A method according to claim 2 comprising:
   while maintaining at least one of power and a signal to the component verifying component operation about the defect to determine a status of the component about the defect; and,
   when the defect is still present and while maintaining at least one of power and a signal to the component firing the laser having a short pulse duration of less than a nano-second at least once in order to remove material from the component.

6. A method according to claim 5 comprising aligning the laser beam and an aligning beam.

7. A method according to claim 6 wherein aligning the laser beam and the aligning beam is performed until a suitable overlap is achieved by iterating the steps of:
   directing and focusing both of the laser beam and the alignment beam onto a thin sample to form a first and second focal spot;
   determining the overlap between the first and second focal spot by capturing reflected or/and transmitted light of the alignment beam from a structure machined in the thin sample by the laser beam; and
   modifying alignment between the laser beam and the alignment beam.

8. A method according to claim 7 wherein the thin sample is foil.

9. A method according to claim 8 wherein the alignment beam is a laser beam of low energy.

10. A method according to claim 7 wherein the laser is for producing femtosecond laser pulses.

11. A method according to claim 7 wherein the laser is a high energy laser for delivering light pulses for which the width is sufficiently short and the intensity sufficiently high to minimize peripheral damage while still removing material around the region of focus.

12. A method according to claim 1 wherein the laser is a high energy laser for delivering light pulses for which the width is sufficiently short and the intensity sufficiently high to minimize peripheral damage while still removing material around the focal region.

13. A method according to claim 12 wherein the laser is for producing femtosecond laser pulses.

14. A method according to claim 13 wherein the component is a QWIP-LED.

15. A method according to claim 13 wherein the component is a micro-channel plate.

16. A method according to claim 1 wherein the laser pulse duration is below 1 ns and the pulse energy is between 100 pJ and 1 mJ.

17. A method according to claim 16 wherein the component is a micro-channel plate.

18. A method according to claim 1 comprising aligning an aligning beam and the laser beam comprising:

until a suitable overlap is achieved, iterating:

directing and focusing both of the laser beam and the alignment beam onto a thin sample to form a first and second focal spot;

determining the overlap between the first and second focal spot by capturing reflected or/and transmitted light of the alignment beam from a structure machined in the thin sample by the laser beam; and modifying alignment between the laser beam and the alignment beam.

19. A method according to claim 1 comprising:

determining a distance of a surface of the component from a focus point of the short pulse laser by imaging a beam in reflection from the surface of the component; and, adjusting the distance of the surface of the component from the focus point of the high power laser by moving one of the component and the focusing optics.

20. A method according to claim 19 wherein the imaged beam is the high power laser beam and wherein imaging the high power laser beam in reflection is performed during a step ablating material.

21. A method according to claim 19 wherein the imaged beam is the alignment beam.

22. A method according to claim 19 wherein the method is used during fabrication of components before they are fully functional and wherein providing one of power and a signal to the component involves providing one of power and a signal to specific locations within the component to identify defects therein.

23. A method according to claim 1 comprising:

controlling the laser pattern projected onto the component by one of:

moving the focusing optics transversely, moving the component transversely, and shaping short pulse laser beam before focusing it onto the component.

24. A method according to claim 1 wherein the component is a micro-channel plate.

25. A method according to claim 1 wherein the component is a micro-channel plate during fabrication thereof.

26. A method as claimed in claims 1 wherein the component has defects on its surface.

27. A method as claimed in claim 1 wherein the component has defects below its surface.

* * * * *